United States Patent [19]

Kupfer

[11] Patent Number: 4,803,549

[45] Date of Patent: Feb. 7, 1989

[54] LOW-PASS FILTER FOR LIMITING THE FREQUENCY BAND OF A LUMINANCE SIGNAL

[75] Inventor: Karl-Heinz O. Kupfer, Krefeld, Fed. Rep. of Germany

[73] Assignee: U.S. Philips Corporation, New York, N.Y.

[21] Appl. No.: 880,401

[22] Filed: Jun. 30, 1986

[30] Foreign Application Priority Data

Jul. 3, 1985 [DE] Fed. Rep. of Germany ....... 3523753

[51] Int. Cl.⁴ ............................................. H03H 7/01
[52] U.S. Cl. ..................................... 358/39; 333/167; 333/138
[58] Field of Search ............... 333/167, 174, 176, 138; 358/37, 39, 21 R, 31, 320, 325, 337

[56] References Cited

U.S. PATENT DOCUMENTS 4,600,903 7/1986 Temer ............................. 333/174 X
4,677,462 6/1987 Bell ...................................... 358/39

FOREIGN PATENT DOCUMENTS 3434321 3/1986 Fed. Rep. of Germany ........ 358/39

Primary Examiner—Eugene R. LaRoche
Assistant Examiner—Benny Lee

[57] ABSTRACT

The invention relates to a low-pass filter for limiting the frequency band of a luminance signal and for delaying said luminance signal, in particular intended for use in the recording channel of a video recording apparatus before the FM modulator. The luminance signal components above a cut-off frequency are attenuated by means of a ceramic filter (11, 31) which is connected to a point of constant potential (earth) and the luminance signal is delayed by means of a delay line (7, 35) arranged in the signal path.

8 Claims, 1 Drawing Sheet

LOW-PASS FILTER FOR LIMITING THE FREQUENCY BAND OF A LUMINANCE SIGNAL

The invention relates to a low-pass filter for limiting the frequency band of a luminance signal, in particular the luminance signal before an FM modulator in the recording channel of a video recording apparatus, comprising a delay line arranged in a signal path between an input and an output of the low-pass filter to delay the luminance signal.

Such a low-pass filter is known from Funkschau 15/1984, pages 42–45. In television technology it is often required that signals above a cut-off frequency should be suppressed sharply. For example, in video recorders all the frequencies above a cut-off frequency should be suppressed in order to ensure a correct processing of the luminance signal. This suppression is necessary because the luminance signal is frequency-modulated before it is recorded on the tape and all signal frequencies above the FM carrier frequency should be suppressed in order to prevent interference. In home-entertainment video recorders the frequency of this carrier wave is 3 MHz. The luminance signal and the chrominance signal are processed in separate amplifier channels and have different propagation delays. Generally, the low-pass filter for suppressing the higher frequencies is also used for delay equalization in the luminance channel.

As such a low-pass filter is required to have a maximum attenuation for in particular the 4.43 MHz chrominance carrier but a minimum attenuation for the luminance signal at 3 MHz, the construction of known low-pass filters of this type is generally very intricate. These filters employ a plurality of coils whose inductance must be adjusted accurately during manufacture. Moreover, since the inductance values should be very accurate, aging effects manifest themselves accordingly.

It is the object of the invention to provide a low-pass filter for television signals whose construction is as simple as possible but which guarantees an optimum attenuation of the higher frequencies and a minimum influence on signal frequencies below a cut-off frequency.

According to the invention this object is achieved in that there is provided a ceramic filter which is connected to a point of constant potential to attenuate signal components above a cut-off frequency. The point of constant potential can be ground potential. Such a filter is of a simple construction and has a very good attenuation characteristic. It requires no adjustment and by a suitable choice of the resistors it enables a correct termination of the input and output to be obtained. The component parts of this low-pass filter can be mounted automatically. Another significant advantage is that reflections of signal components in the filter are minimised.

From the publication "The two-chip integration for color television receivers" by M. Yoshitomi et al, IEEE Transactions on Consumer Electronics, Vol. CE-28, No. 3, August 1982, pages 184–191, it is known to employ a ceramic filter in a television set. However, the purpose of this filter is not to limit the frequency band of a luminance signal.

In an embodiment of the invention the input is coupled to the output by a series arrangement of a first resistor, the delay line, a second resistor and a third resistor, in that the junction point between the second and the third resistor is connected to the point of constant potential by the ceramic filter, and in that the output is also connected to the point by a parallel arrangement of a fourth resistor and a capacitance.

This circuit arrangement ensures that the ceramic filter provides a very effective attenuation of the higher frequencies because the filter is arranged after the series arrangement of the first and the second resistor and the delay line, which have comparatively high impedances. At the output of the filter the high frequencies are again attenuated by the earthed parallel arrangement of a resistor and a capacitor.

In another embodiment of the invention the input is coupled to the output by a series arrangement of a first resistor, a second resistor and the delay line, in that the junction point between the first resistor and the second resistor is connected to the point of constant potential by the ceramic filter, and in that the output is also connected to the said point by a third resistor.

In principle, this filter has the same advantages but in the present embodiment the input resistor is directly followed by the ceramic filter to which the delay line is connected by a matching resistor.

In a further embodiment of the invention the low-pass filter is preceded by a 5.5-MHz filter.

If residual audio frequencies, i.e. frequencies around 5.5 MHz should appear on the video output of a preceding IF demodulator, the low-pass filter of both disclosed embodiments may be preceded by a 5.5-MHz filter. This filter may be of a known construction but may also be a ceramic filter coupled to the said point of constant potential, such as ground potential.

Two embodiments of the invention will now be described in more detail, by way of example, with reference to the accompanying drawing. In the drawing.

Figure 1:
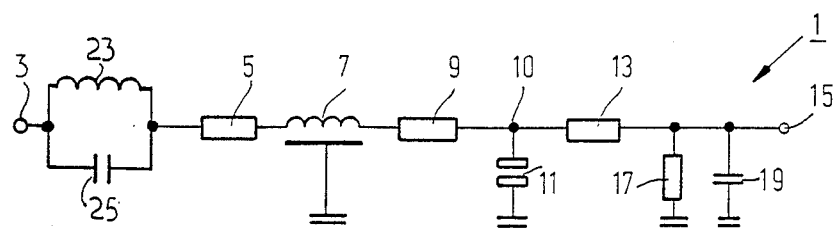
FIG. 1 shows a first embodiment of the invention.

FIG. 1 shows a low-pass filter 1 for limiting the frequency band of the luminance signal in a video recorder, which filter comprises an input 3 followed by the 5.5 MHZ filter of inductance 23 and capacitance 25, if desired, followed by a series arrangement of an input resistor 5, a delay line 7, a matching resistor 9 and an output resistor 13. A ceramic filter 11 is arranged between earth and the junction point 10 between the matching resistor 9 and the output resistor 13. A resistor 17 and a capacitor 19 are each arranged between ground and the connection between the resistor 13 and the output 15 of the low-pass filter.

Figure 2:
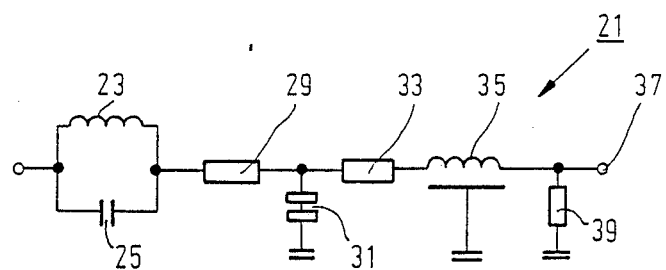
FIG. 2 shows a second embodiment of the invention.

A 5.5-MHz filter of known construction comprising the parallel arrangement of an inductance 23 and a capacitance 25 is arranged in the signal path at the input 27 of the low-pass filter 21 shown in FIG. 2. This 5.5 MHz filter is followed by the low-pass filter 21. A ceramic filter 31 is arranged between earth and the junction point between the input resistor 29 and the matching resistor 33. The matching resistor 33 is followed by a delay line 35 whose output constitutes the output 37 of the low-pass filter, a resistor 39 being connected between this output and earth.

In both embodiments the resonant frequency selected for the ceramic filter is 4.43 MHz, corresponding to the chrominance carrier frequency for which a very high attenuation is required. The delay line is of known construction and has a delay of, for example, 680 nsecs.

What is claimed is:

1. A low-pass filter for limiting the frequency band of a luminance signal, in particular the luminance signal in the recording channel of a video recording apparatus, comprising an input terminal and an output terminal, a signal path extending between said input and output terminals, a delay line coupled in said signal path, a ceramic filter connected to said signal path and to a point of constant potential to attenuate signal components above a cut-off frequency, and a 5.5 MHz attenuating filter connected in said signal path at a location before the connection of said ceramic filter.

2. A low-pass filter as claimed in claim 1 wherein said input terminal is coupled to said output terminal, along said signal path, by a series arrangement of a first resistor, the delay line, a second resistor and a third resistor, the junction point between the second and the third resistor being connected to the point of constant potential by said ceramic filter, and wherein a parallel arrangement of a fourth resistor and a capacitance connects said output terminal to said point of constant potential.

3. A low-pass filter as claimed in claim 1 wherein said input terminal is coupled to said output terminal, along a signal path, by a series arrangement of a first resistor, a second resistor and said delay line, the junction point between the first resistor and the second resistor being connected to the point of constant potential by the ceramic filter, and wherein a third resistor connects said output terminal to said point of constant potential.

4. A low-pass filter for limiting the frequency band of a luminance signal, in particular the luminance signal for an FM modulator in the recording channel of a video recording apparatus, comprising an input terminal and an output terminal, a signal path extending between said input and output terminals, a delay line coupled in said signal path and a ceramic filter connected to said signal path and to a point of constant potential to attenuate signal components above a cut-off frequency, said input terminal being coupled to said output terminal, along said signal path, by a series arrangement of a first resistor, the delay line, a second resistor and a third resistor, the junction point between the second and the third resistor being connected to the point of constant potential by said ceramic filter, and wherein a parallel arrangement of a fourth resistor and a capacitance connects said output terminal to said point of constant potential.

5. A low-pass filter for limiting the frequency band of a luminance signal, in particular the luminance signal for an FM modulator in the recording channel of a video recording apparatus, comprising input and output terminals for said low-pass filter, a signal path extending between said input and output terminals, a delay line coupled in said signal path and a ceramic filter connected to said signal path and to a point of constant potential to attenuate signal components above a cut-off frequency, said delay line being connected in said signal path at a location closer to said input terminal than the connection of said ceramic filter to said signal path.

6. A low-pass filter as claimed in claim 5 wherein said input terminal is coupled to said output terminal, along said signal path, by a series arrangement of a first resistor, the delay line, a second resistor and a third resistor, the junction point between the second and the third resistor being connected to the point of constant potential by said ceramic filter, and wherein a parallel arrangement of a fourth resistor and a capacitance connects said output terminal to said point of constant potential.

7. A low-pass filter as claimed in claim 5 wherein said input terminal is coupled to said output terminal, along said signal path, by a series arrangement of a first resistor, a second resistor and said delay line, the junction point between the first resistor and the second resistor being connected to the point of constant potential by the ceramic filter, and wherein a third resistor connects said output terminal to said point of constant potential.

8. A low-pass filter as claimed in any one of claims 5 or 7 wherein the ceramic filter is preceded in said signal path by a 5.5 MHz attenuating filter.

* * * * *